United States Patent [19]
Haberland et al.

[11] Patent Number: 5,410,272
[45] Date of Patent: Apr. 25, 1995

[54] RF AMPLIFIER SIGNAL-LEVEL CONTROL, AND RADIO TRANSMITTER EQUIPPED THEREWITH

[75] Inventors: Bernd Haberland, Stuttgart; Günther Hoen, Ditzingen; Ralf Wölfle, Stuttgart, all of Germany

[73] Assignee: Alcatel N.V., Amsterdam, Netherlands

[21] Appl. No.: 231,127

[22] Filed: Apr. 22, 1994

[30] Foreign Application Priority Data

Apr. 22, 1993 [DE] Germany ............... 43 13 152.2

[51] Int. Cl.⁶ ................. H03G 3/20; H04B 1/04
[52] U.S. Cl. ........................... 330/129; 330/279; 455/116; 455/126
[58] Field of Search ............ 330/127, 129, 279; 455/116, 126, 127

[56] References Cited

U.S. PATENT DOCUMENTS

| | | | |
|---|---|---|---|
| 4,992,753 | 2/1991 | Jenson et al. | 330/279 X |
| 5,159,283 | 10/1992 | Jensen | 330/279 X |

FOREIGN PATENT DOCUMENTS

| | | |
|---|---|---|
| 0096820 | 6/1983 | European Pat. Off. . |
| 0412392 | 2/1991 | European Pat. Off. . |
| 0468507 | 1/1992 | European Pat. Off. . |
| 9204771 | 3/1992 | WIPO . |

*Primary Examiner*—James B. Mullins
*Attorney, Agent, or Firm*—Ware, Fressola, Van Der Sluys & Adolphson

[57] ABSTRACT

The object of the invention is to design a stably controlled RF amplifier for controlling the level characteristic of an RF signal, particularly a TDMA radio signal, whose desired-level characteristic is predetermined anew from one time interval to the next.

An RF amplifier (PA) has a control circuit (CC) which controls a change of the level characteristic (SL) of an RF signal (Pin, Pout) from time interval to time interval by evaluating the actual-level characteristic of the RF signal differently within two or more segments (AT, GT) of the respective time interval (T1[k]). Advantageously, the control action of the RF amplifier during a first segment (GT), in which the signal level changes from one step to the next, differs from that during the second segment (AT), in which the signal level is constant. Temporary storage of correction values permits stable off-line control.

14 Claims, 2 Drawing Sheets

RF AMPLIFIER SIGNAL-LEVEL CONTROL, AND RADIO TRANSMITTER EQUIPPED THEREWITH

TECHNICAL FIELD

The present invention relates to an RF amplifier for changing the level characteristic of an RF signal divided into successive time intervals, particularly of a TDMA radio signal, in a controlled manner, and to a radio transmitter with such an RF amplifier.

BACKGROUND OF THE INVENTION

An RF amplifier of this kind is disclosed, for example, in EP 0 096 820 B1. This RF power amplifier modulates and amplifies RF carrier signals by means of a digital feedback control system to form pulse-shaped radio signals of a predetermined shape. Accordingly, uniform RF pulses following each other successively in time are generated. A continuous desired-value/actual-value comparison within the control corrects the RF pulses, whose level characteristic is severely distorted during amplification. Use is made of buffers, so that the correction can be performed in the intervals between pulses. The feedback control loop is open during the correction, and high overall control stability is obtained, particularly if uniform RF pulses are generated. WO 92/04771 discloses a power amplifier for amplifying a TDMA radio signal (TDMA: time-division multiple access) whose power changes from time interval to time interval, i.e., the level characteristic of the TDMA radio signal is set anew for each time interval. The power amplifier described is particularly suitable for use in GSM radio transmitters (GSM: Global System for Mobile Communication). The power amplifier is dynamically controlled, so that the power level of the TDMA radio signal adjusts itself to a newly predetermined desired value from time interval to time interval. Power control is effected by means of digital circuits which change the level of the radio signal.

SUMMARY OF THE INVENTION

It is the object of the invention to design a stably controlled RF amplifier for controlling the level characteristic of an RF signal, particularly a TDMA radio signal, whose desired-level characteristic is determined anew from one time interval to the next.

This object is attained by providing an RF amplifier having a control circuit which evaluates the actual-level characteristic of the RF signal differently within two or more segments of the respective time interval for each of which a desired-level characteristic is predetermined. Such an RF amplifier is provided having a digital feedback control loop which evaluates the level characteristic of an RF signal differently in two or more segments of successive time intervals, thus changing the level characteristic of this RF signal in a controlled manner. The actual-level characteristic during each time interval is evaluated within the control in a discriminating manner by dividing the respective time interval into two or more segments each of which have a characteristic actual-level curve. The different evaluations in the segments can be adapted to the corresponding characteristic actual-level curve in such a way that, e.g. despite segments with large changes in signal level, stable control is effected. A radio transmitter with such an RF amplifier is also described.

Further advantageous features of the invention are defined in the subclaims.

BRIEF DESCRIPTION OF THE DRAWINGS

The invention will become more apparent from the following description of an embodiment for a GSM base station when taken in conjunction with the accompanying drawings, in which.

BEST MODE FOR CARRYING OUT THE INVENTION

Figure 1A:
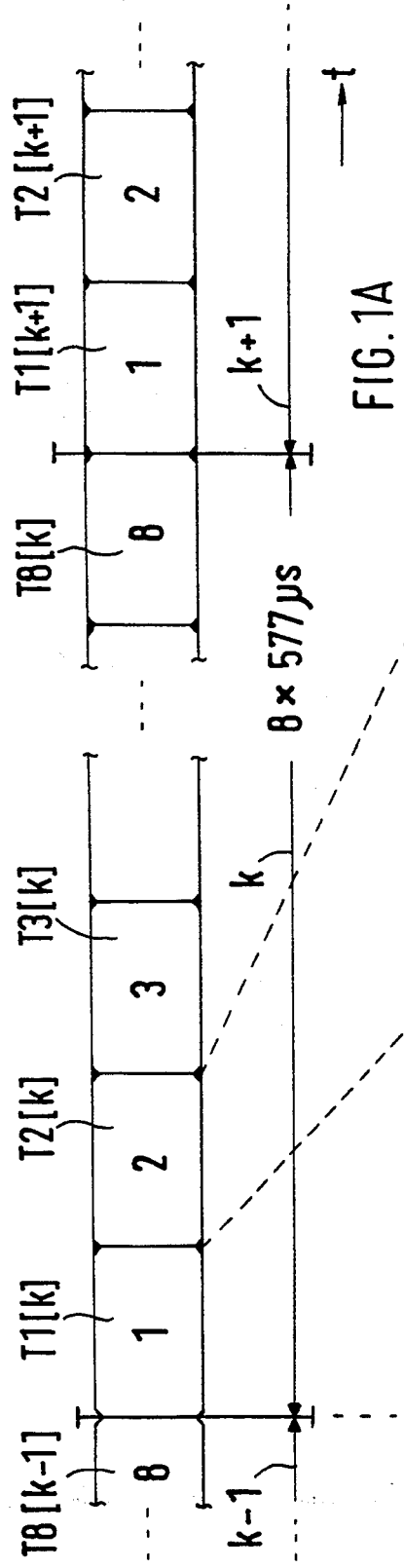
FIG. 1a) shows the structure of a TDMA radio signal as is required by the GSM standard.

Referring to FIG. 1a, a TDMA radio signal transmitted by the base station is divided into eight successive time intervals $T1[k]$, $T2[k]$, ..., $T8[k]$. Each time interval represents a radio channel which can be accessed by a mobile-radio subscriber using TDMA techniques. Eight time intervals, also called "time slots", form a frame k. The cyclic sequence from time slot to time slot is repeated at intervals of 8.577 $\mu s = 4.6$ ms. In TDMA radio transmitters, an RF amplifier commonly adjusts the power of the TDMA radio signal to the respective radio call from time interval to time interval. According to the GSM standard, for example, corresponding changes in signal level are 30 dB at the most.

Figure 1B:
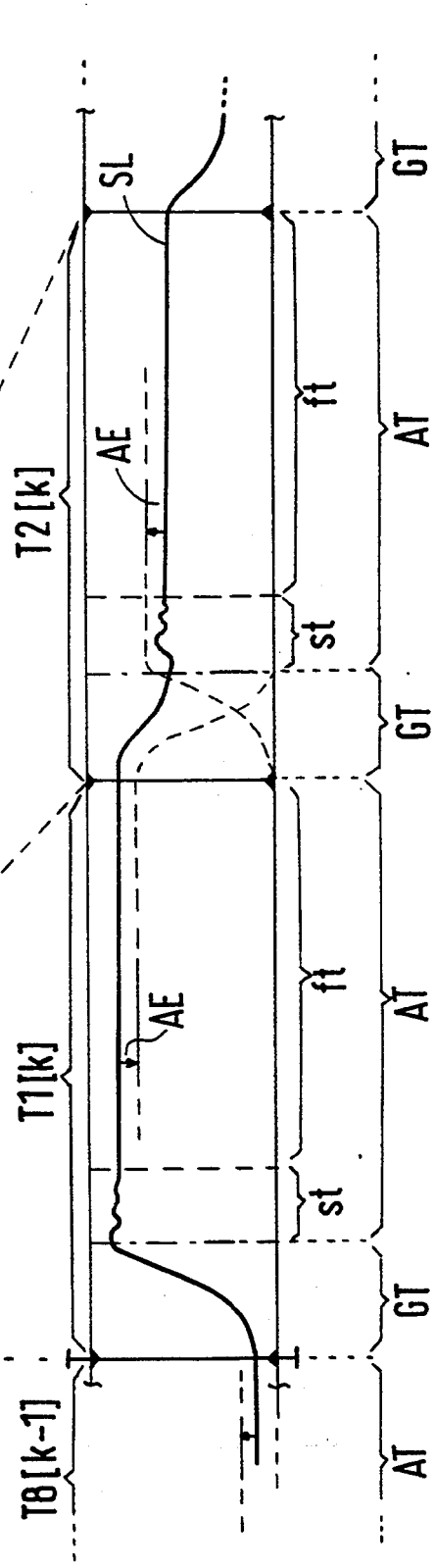
FIG. 1b) shows a typical level characteristic of this TDMA radio signal and its subdivision into segments in accordance with the present invention.

FIG. 1b) illustrates a corresponding level characteristic from a time interval $T8[k-1]$ of a preceding frame to a time interval $T2[k+1]$ of the next frame. The level characteristic shown, SL, corresponds to the actual-level characteristic at the output of the RF power amplifier of a TDMA radio transmitter. The subdivision of the respective time intervals into two or more segments in accordance with the invention is illustrated by the example of two successive time intervals $T1[k]$ and $T2[k]$.

By way of example, FIG. 1b) shows a subdivision of each time interval into a first segment GT, which covers the dynamic level characteristic, and a second segment AT, which covers the static level characteristic. As shown, the second segment AT of the respective time interval covers a period in which the level characteristic SL is to be maintained constant. According to GSM recommendations, the actual signal level at the output of the RF amplifier may vary by a maximum of $\pm 1$ dB about a constant value. The first segment GT of the respective time interval extends over a period in which the signal level is dynamically adapted from the constant level value of the preceding time interval to the new level value. In this transitional phase, a large change in signal level by 70 dB or more may occur particularly if a change from or to a zero level is to take place from time interval to time interval.

The segments GT and AT cover characteristic signal-level curves within each time interval. The novel RF amplifier controls the change in signal level, allowing for the fact that such different characteristic signal-level curves exist in each segment. In this embodiment, therefore, a constancy error value AE is determined which represents the deviation of the actual signal level within the second segment AT from a predetermined, fixed value. Within the first segment GT, no error values are determined directly. For the first, dynamic segment GT, the deviation of the actual-level characteristic from the predetermined, e.g., $\cos^2$-shaped, desired-level characteristic is derived from the two constancy error values of the adjacent time intervals.

The subdivision of the respective time interval illustrates the discriminating control action of the RF amplifier within the first segment GT, which corresponds to the transitional interval, and within the second segment AT, which corresponds to the useful interval of the radio signal. To further improve the control, the respective second segment AT is subdivided into two subsegments st and ft.

The operation of the RF amplifier will now be described with the aid of FIG. 2.

Figure 2:
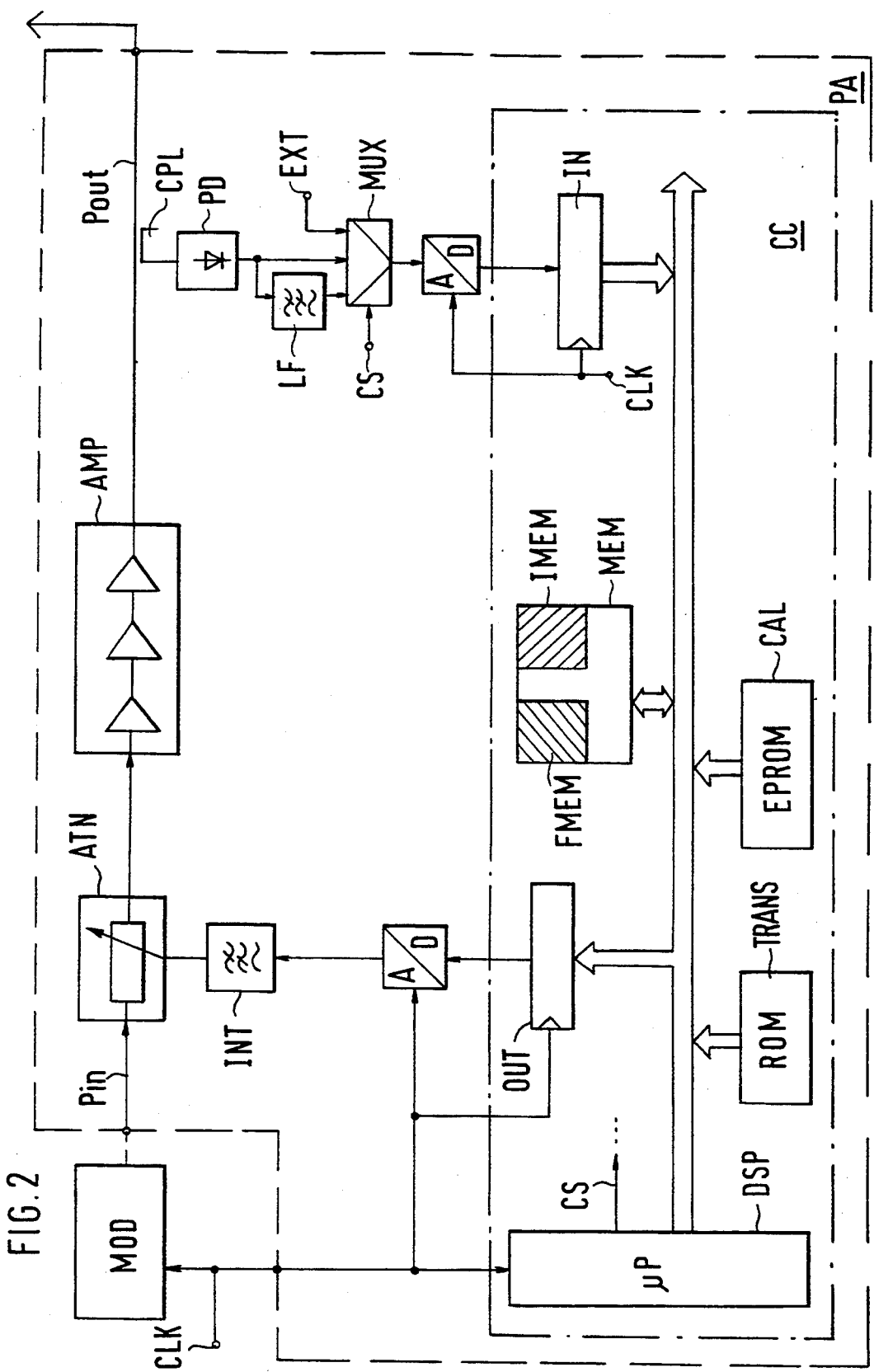
FIG. 2 shows an RF amplifier for controlled power amplification of this TDMA radio signal.

FIG. 2 shows the modulating stage MOD of a radio transmitter with a subsequent RF amplifier PA which controls the power of a TDMA radio signal. The radio transmitter is part of a GSM base station and radiates a TDMA radio signal whose power level is set anew from one time interval to the next. This TDMA radio signal is formed by means of the RF amplifier as follows. A fixed-level RF signal Pin coming from the modulating stage MOD and modulated with a TDMA signal is applied to a variable attenuator ATN for envelope modulation and then fed into an output-amplifier stage AMP. The power-amplified RF signal Pout leaves the RF amplifier as a TDMA radio signal with a power level predetermined anew from time slot to time slot, and is fed to an antenna. A fraction of the power-amplified RF signal Pout is fed by means of a directional coupler CPL into a feedback control system which is described in detail below. This feedback control system varies the attenuation of the variable attenuator ATN in such a way that the level of the RF signal changes in accordance with the respective desired value predetermined anew from time interval to time interval.

The portion of the power-amplified RF signal Pout coupled out by means of the directional coupler CPL is fed to an envelope detector PD which generates a measurement signal whose waveform corresponds to the actual power-level characteristic of the RF signal Pout. This measurement signal is applied directly and through a parallel low-pass filter LF to an analog multiplexer MUX. Furthermore, an external monitoring signal EXT is presented to one of the inputs of this analog multiplexer MUX. The output of the analog multiplexer MUX is digitized by means of an analog-to-digital converter and read by a processor-controlled digital circuit CC. The processor-controlled digital circuit CC stores the digitized output signal from the analog multiplexer MUX, e.g., 52 sample values per time interval, in an input buffer IN. At the output end, the processor-controlled digital circuit CC has a corresponding output buffer OUT which provides digital control signals that are applied through a digital-to-analog converter and a subsequent intergrator INT to the control input of the attenuator ATN.

At the heart of the processor-controlled digital circuit CC is a signal processor DSP which is incorporated in the feedback control system via the aforementioned buffers. A suitable processor is, for example, the type 561001 of Motorola Inc. The digital circuit CC further includes a working memory MEM, a read-only memory TRANS, and a characteristic-curve memory CAL. All aforementioned components of the processor-controlled digital circuit CC are interconnected by an address and data bus and cooperate as follows:

During each time interval, the actual-level characteristic of the power-amplified RF signal Pout is sampled. For each time interval, only sample values from the static segment AT, henceforth called "actual-level values", are written into the input buffer IN and evaluated for power control. The input buffer contains the respective actual-level values of the two sampled time intervals. By means of a desired-value/actual-value comparison, a constancy error value AE is determined from time interval to time interval. The dynamic segment GT of each time interval is not evaluated, but is corrected by means of particular constancy error values, as is described in more detail below.

The constancy error value of a given time interval, e.g. T2[k], is used to control the static segment AT of the corresponding time interval within the next TDMA frame, i.e., in this example the static segment AT of T2[k+1].

The constancy error values of every two adjacent time intervals, such as T1[k] and T2[k] serve to correct the dynamic segment GT of the corresponding transitional phase within the next TDMA frame, i.e., in this example the dynamic segment GT of T2[k+1]. This adaptive correction eliminates the need for a complicated direct control of the dynamic segments. The input buffer contains the actual-level values of the respective last sampled time interval and those of the preceding time interval, i.e., in this example the actual-level values of the time intervals T2[k] and T1[k]. The evaluation of the actual-level values provides control values for the corresponding time intervals T1[k+1] and T2[k+1] of the next TDMA frame. Referred to one respective time interval, the control is interrupted for the duration of a whole TDMA frame. The processor-controlled digital circuit CC thus effects stable power control, so that nonlinearities and temperature drift of the output-amplifier stage AMP and of the attenuator ATN are corrected.

For a more detailed description of the operation of the processor-controlled digital circuit CC, the following two cases will now be considered:

1) In the cyclic case, the control is in a steady state, and the level characteristic of the RF signal to be controlled is uniform from frame to frame. In this case, a given mobile-radio subscriber is unambiguously assigned to each time interval, so that the signal-level characteristic within a frame is exemplary for the following frames. Each time interval is assigned a power signal level which is to be maintained within the corresponding static segment AT. The respective dynamic segments GT are transitional phases in which the signal level is changed in accordance with a $\cos^2$ curve. The processor-controlled digital circuit CC calculates the control values for the attenuator ATN for the respective coming time interval (e.g., T2[k+1]) after the actual-level values of the corresponding time interval (T2[k]) in the preceding frame have been detected.

The actual-level values are derived by sampling as follows. The signal processor DSP controls the analog multiplexer MUX by means of a control signal CS at the beginning of each time interval in such a way that the low-pass filtered, detected signal is sampled during the second, static segment AT (see FIG. 1b). The low-pass filtering smoothes the detected actual-level characteristic and thus eliminates radio-frequency interference, such as any residual amplitude modulation of the RF signal Pout. In the evaluation of the corresponding actual-level values, level fluctuations occurring during the transient phase st of the low-pass filter LF are not taken into account. Only the actual-level values from the following, steady-state phase ft of the filter (see FIG. 1b) are evaluated, e.g. 12 of 52 sample values.

Over the 12 sample values remaining in this example, the linear average is taken. The characteristic-curve data of the envelope detector PD, stored in the characteristic-curve memory CAL, serve to convert the sample values from the voltage domain into the power domain. Next, the linear average is taken over the converted sample values. The calculated average value thus represents the average power level of the RF signal Pout within the second, static segment AT of the time interval T2[k]. A comparison between this corrected average value and the constant desired-level value for this segment, which is stored in the working memory MEM, gives a constancy error value AE which is characteristic of the level deviation of the RF signal Pout in this static segment. The constant desired-level value for the respective time interval to be adjusted is provided by a digital unit, the so-called frame unit (not shown). This frame unit specifies, inter alia, the power step to be set in accordance with the current contents of the time slots.

By means of the constancy error value AE determined in the respective last time interval T2[k], the processor-controlled digital circuit CC corrects the constant desired-level value for the corresponding time interval T2[k+1] in the next frame to form a constancy control value. The latter is stored in a frame memory FMEM which forms part of the working memory MEM. Within the static segments in the next frame, the attenuator ATN is controlled by means of the corresponding constancy control values which are stored in the frame memory for the duration of one frame each. In this description, the constancy control value for a static segment represents the equal digital values (e.g., 27 digital values) required to control the digital-to-analog converter. The respective second segment AT is characterized by a constancy control value which determines the respective power step to be set from time interval to time interval. The transition from this power step to the next takes place in the first segment GT. The control values for this transient signal-level characteristic are calculated by means of the constancy control values for the corresponding power steps and by means of data from the read-only memory TRANS. The data characterize a $\cos^2$-shaped standard curve and are adapted by weighting factors to the required dynamics of the respective power-step transition, i.e., to the difference of the two constancy control values. The weighted standard-curve data form the control values which characterize this transient signal section, and which will hereinafter be referred to as "dynamics control values".

The determined dynamics control values, e.g. 25 values, are also stored in the frame memory FMEM for the duration of one frame. The dynamics control values need not be calculated if the corresponding constancy control values do not change from frame to frame, i.e., if the signal-level characteristic is stable. In that case, the contents of the frame memory FMEM remain unchanged.

The RF amplifier PA keeps the level of the RF signal very stable because, inter alia, the control differentiates between those different time segments in which the signal level has a typical characteristic. For example, the low-pass filtering within the second segment AT effects a stable control of this static segment. The second, dynamic segment GT is advantageously controlled by adapting the necessary dynamics control values to the corresponding constancy control values.

Besides the detected signal level, the external monitoring signal EXT, which is fed into the analog multiplexer MUX, is evaluated by means of the processor-controlled digital circuit CC. This external monitoring signal EXT may be provided, for example, by a temperature sensor which monitors the output-amplifier stage AMP. In case of overheating, an alarm signal is generated by means of the signal processor DSP. It is also advantageous to monitor the RF termination at the amplifier output, i.e., the correct connection to the antenna, so that no RF power will be reflected to the amplifier output. To this end, a suitable circulator stage could feed a further external monitoring signal into the feedback control system. As shown in FIG. 2, the processor-controlled digital circuit CC and the modulating stage MOD, which is located at the input of the RF amplifier PA, are clocked by common clock signals, so that synchronization of the burst-modulated RF signal with the digital portion of the feedback control system is ensured.

2) In the noncyclic case, uniform repetition of the signal-level characteristic from one frame to the next is not ensured. This is to be expected in the general operating state of the illustrated RF amplifier for a GSM base station, since from frame to frame, individual or several time intervals are assigned to new mobile-radio subscribers (e.g., by frequency hopping and power control). Furthermore, individual time intervals are not always occupied, so that no useful transmitting power is required in such a time interval. In that case, the output amplifier stage AMP is advantageously turned off during such a time interval so as to avoid unnecessary radiation via the antenna.

In the noncyclic case, new dynamics control values for the respective transition from one static segment to the next must be made available from frame to frame. Respective calculation and adaptation by means of the data stored in the read-only memory TRANS is advantageously avoided as follows: If a given transition from one power level to another is required for the first time, the dynamics control values which characterize this transition are determined, and stored in an initialization memory IMEM. These dynamics control values can be retrieved from the initialization memory at any time if a corresponding, like transition is required within another second segment GT. To reduce the amount of storage required, only those dynamics control values are stored in the initialization memory which determine the transition from or to a zero level, i.e., to an unoccupied time interval. Thus, for 16 possible power steps, for example, 32 transition functions are conceivable. For each required transition function, a given set of 25 dynamics control values are stored at a characteristic address in the initialization memory IMEM. This may be done when the amplifier is put into operation. During operation, deviations with respect to the 16 power steps can be determined with the aid of the constancy error values (AE) and used to correct the dynamics control values stored in IMEM.

Below a certain power-level difference of, e.g., −30 dBc, a harmonious transition from zero level to a power step or vice versa is not absolutely necessary, so that no calculation of dynamics control values is needed here. Abrupt turn-on or turn-off of the amplifier causes only a negligible spectral disturbance in the range of low output power of the RF signal. The control can be further optimized correspondingly.

The RF amplifier described is particularly suited to controlling the power of a TDMA radio signal according to the GSM standard. It only represents a particularly advantageous embodiment of the RF amplifier according to the invention. A multitude of further embodiments, such as a highly dynamic RF power amplifier for secondary radar systems, is conceivable.

We claim:

1. An RF amplifier (PA) for changing the level characteristic (SL) of an RF signal (Pin, Pout) divided into successive time intervals (T1, T2, ..., T8), characterized by a control circuit (CC) responsive to an actual-level characteristic of at least two successive time intervals of the RF signal (Pout) for providing a desired-level characteristic signal for each of said successive time intervals, said actual-level characteristic of the RF signal comprising two or more segments (GT, AT), said control circuit (CC) evaluating said two or more segments differently for providing said desire-level characteristic signals.

2. An RF amplifier (PA) as claimed in claim 1, characterized in that during said at least two successive time intervals (T1[k]; T2[k], the control circuit (CC)
   is responsive to a first segment (GT) of the actual-level characteristic, for providing a dynamic desired-level characteristic signal,
   is responsive to a second segment (AT) of the actual-level characteristic, for providing a constancy error value (AE) as the comparison of said second segment (AT) and a desired value, and
   is responsive to said constancy error value (AE) for providing a constant desired-level characteristic signal.

3. An RF amplifier (PA) as claimed in claim 2, characterized in that a low-pass filter (LF) is responsive to said second segment (AT) for providing a smoothed second segment signal, said control circuit being responsive to said smoothed second segment signal for providing said constancy error value (AE).

4. An RF amplifier (PA) as claimed in claim 3, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

5. An RF amplifier (PA) as claimed in claim 2, characterized in that the control circuit is a processor-controlled digital circuit (CC) responsive to said second segment (AT) for providing an actual average value signal, and responsive to said actual average value signal for providing the constancy error value (AE).

6. An RF amplifier (PA) as claimed in claim 5, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

7. An RF amplifier (PA) as claimed in claim 2, characterized in that the control circuit is a processor-controlled digital circuit (CC)
   which is responsive to the constancy error value (AE) corresponding to a current time interval (T2[k]) of said successive time intervals for providing the constant desired-level characteristic signal corresponding to a time interval (T2[k+1]) subsequent to said current time interval, and
   which is responsive to the constancy error values of two successive time intervals (T1[k], T2[k]) for providing the dynamic desired-level characteristic signal within a time interval (T2[k+1]) subsequent to said two successive time intervals, thereby adapting the transition from one signal level to the next.

8. An RF amplifier (PA) as claimed in claim 7 wherein said RF signal is a TDMA radio signal consisting of frames (k−1, k, k+1, ...) each comprising a number of time intervals (T1[k], T2[k], ..., T8[k]), characterized in that the processor-controlled digital circuit (CC) is responsive to the constancy error values (AE) provided within a current frame (k) for providing control values, and for storing said control values temporarily in a frame memory (FMEM), and is responsive to the constant desired-level characteristic signals within a subsequent frames (k+1) and said current frame being approximately equal for using said control values temporarily stored in said frame memory to provide the dynamic desired-level characteristic signal during said subsequent frame.

9. An RF amplifier (PA) as claimed in claim 7, characterized in that in response to a first occurrence of a signal-level transition, the processor-controlled digital circuit (CC) provides dynamics control values for adapting the dynamic, first segment (GT; T2[k+1]) to the adjoining constant, second segments (AT; T1[k+1], T2[k+1]) according to a $\cos^2$ curve, stores said dynamics control values in an initialization memory (IMEM), and, in response to a second signal-level transition, uses said dynamic control values to control the dynamic desired-level characteristic within a subsequent first segment (GT).

10. An RF amplifier (PA) as claimed in claim 7, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

11. An RF amplifier (PA) as claimed in claim 2, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

12. An Rf amplifier (PA) as claimed in claim 1, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

13. A radio transmitter comprising an RF amplifier (PA) for controlling the level characteristic (SL) of an RF signal (Pin, Pout) divided into successive time intervals (T1, T2, ..., T8), characterized by a control circuit (CC) responsive to an actual-level characteristic of at least two successive time intervals of the RF signal (Pout) for providing a desired-level characteristic signal for each of said successive time intervals, said actual-level characteristic of the RF signal comprising two or more segments (GT, At), said control circuit (CC) evaluating said two or more segments differently for providing said desired-level characteristic signals.

14. An RF amplifier (PA) as claimed in claim 13, characterized in that said RF signal is a TDMA radio signal divided into said successive time intervals (T2, T2, ..., T8), each of said successive time intervals being a TDMA radio channel, and in that each of said successive time intervals is subdivided into said two or more segments (GT, AT), one of said segments being indicative of a transitional portion of a corresponding one of said successive time intervals and another of said segments being indicative of a useful portion of a corresponding one of said successive time intervals.

* * * * *

UNITED STATES PATENT AND TRADEMARK OFFICE
CERTIFICATE OF CORRECTION

PATENT NO. : 5,410,272
DATED : April 25, 1995
INVENTOR(S) : Haberland et al.

It is certified that error appears in the above-indentified patent and that said Letters Patent is hereby corrected as shown below:

On the title page and column 1, line 1 item [54] after "AMPLIFIER" insert --WITH--

Claim 13, column 10, line 10 "(GT,At)" should read --(GT,AT)--

Signed and Sealed this

Fifth Day of September, 1995

Attest:

BRUCE LEHMAN

Attesting Officer     Commissioner of Patents and Trademarks